United States Patent [19]

Verberg

[11] Patent Number: 5,632,828

[45] Date of Patent: May 27, 1997

[54] COATING PREPARATION FOR PRETREATING METAL SURFACES, AND METHOD EMPLOYING SAID PREPARATION

[75] Inventor: Johannes J. H. Verberg, Nieuwerkerk a/d Ijsel, Netherlands

[73] Assignee: ADW Chemical Products B.V., Netherlands

[21] Appl. No.: 588,347

[22] Filed: Jan. 18, 1996

[30] Foreign Application Priority Data

Feb. 10, 1995 [NL] Netherlands ............................ 9500250

[51] Int. Cl.$^6$ ................................................. C23C 22/30
[52] U.S. Cl. ................................................. 148/251
[58] Field of Search ................................................. 148/251

[56] References Cited

U.S. PATENT DOCUMENTS 3,350,285  10/1967  Nishigaki et al. .
3,403,088   9/1968  Hart .

FOREIGN PATENT DOCUMENTS 0274543   7/1988  European Pat. Off. .
3407283A1  9/1985  Germany .
6504905   11/1965  Netherlands .

OTHER PUBLICATIONS

Abstract of Japanese Patent No. JP60029473 A, Forming Electrically Insulating Film On Steel Sheet—Using LIQ. Medium Contg. Chromic Anhydride, Metal Oxide, Hydroxide, or Carbonate, Resin Emulsion and Poly:Hydric Alcohol.

Abstract of Japanese Patent No. JP52103428 A, Nontacky Waterproof Acrylic Paint Compsn.—Contg. Oxides and/or Hydroxides of Alkaline Earth Metals.

PCT Report Concerning Novelty Search of International Type, Netherlands Application No. 9500250, Application Date: Feb. 10, 1995, including English translation.

*Primary Examiner*—Sam Silverberg
*Attorney, Agent, or Firm*—Brooks & Kushman P.C.

[57] ABSTRACT

A coating preparation for pretreating metals comprises an acrylic acid or a derivative thereof and barium hydroxide in a proportion by weight of 1:0.08–0.30, as well as chromium compounds, the remainder being conventional additives and water. The amount of acrylic acid or derivative thereof is preferably 2–6% by weight. The amount of chromic acid in the chromium compounds in the coating preparation depends on the type of the metal substrate to be treated. Such a preparation combines, in a single preparation, the desired properties for conversion of the metal and adhesion, which means that instead of 2 separate layers, 1 layer is sufficient.

6 Claims, No Drawings

COATING PREPARATION FOR PRETREATING METAL SURFACES, AND METHOD EMPLOYING SAID PREPARATION

TECHNICAL FIELD OF THE INVENTION

The invention relates to a coating preparation for pretreating metal surfaces comprising an acrylic acid or derivative thereof, a hydroxide of a bivalent metal and chromium compounds, the remainder being conventional additives and water.

BACKGROUND OF THE INVENTION

Such a coating preparation per se is known from U.S. Pat. No. 3,350,285. This document discloses a method for coating a metal surface, in particular a thin metal film secured to a plastic substrate used for printed wiring, by means of an immersion process or an electrolytic process, wherein an aqueous solution containing beryllium ions, chromium VI ions and a high molecular weight compound, e.g. polyvinyl alcohol and polyacrylic acid, is employed to provide a rust-proof and corrosion-resistant film on the metal surface.

When metals are being pretreated in preparation for a subsequent finishing process, the metal surfaces like aluminum, steel and galvanized steel usually, after having been degreased and cleaned, have applied to them, first of all, a conversion layer, followed by a so-called "primer" layer. The purpose of applying a conversion layer is, inter alia, to reduce corrosion phenomena of the metal and to increase the moisture resistance of the painted system. The purpose of applying a primer to the conversion layer is to provide a good bonding surface for the finish to be applied afterwards. As a result, corrosion resistance is generally increased further.

The use of a primer, however, entails a number of drawbacks. Firstly, it can be pointed out that any primer has a limited area of application, i.e. a primer of a particular type is not suitable for every type of finish. In addition, the solvent resistance of a primer is limited, which may result in variations in the properties, depending on the type of finish employed. Furthermore, the primer affects the flow, gloss, hardness and colour of the finish. Another drawback of employing a primer is that adhesion between finish and primer depends on the conditions under which these two are employed, such as the layer thickness and the baking temperature. A final disadvantageous factor in employing a primer is formed by the high installation costs and energy costs.

Thus a need for new coating preparations and methods continues to exist, wherein the disadvantages mentioned are reduced or do not occur at all.

A further objective of the invention is to replace the conventional conversion and primer layers by a single coating layer.

SUMMARY OF THE INVENTION

The coating preparation of the above-described type according to the present invention is characterized, to this end, in that the bivalent metal is barium and the proportion by weight of the acrylic acid or derivative thereof and barium hydroxide is 1:0.08–0.30.

The advantage of the aqueous coating preparation containing barium according to the invention is that the properties of a protective layer obtained thereby are better than those of conventional conversion systems, in particular corrosion resistance and adhesion, so that a primer layer is superfluous in many cases. The preparation is thus capable of replacing the conventional conversion and primer layers by a single layer. This goes hand in hand with a layer thickness which is smaller than the total layer thickness of the conventional conversion and primer layer together, which has a positive effect on subsequent processing. The drying time is considerably reduced, operating costs decrease, and also processibility of the end product, for example deformation, becomes simpler as a result.

In a conventional unit, in which only one coating layer can be applied, it is thus possible to achieve results which correspond to those of coating systems composed of a conversion layer, primer layer and top layer. In a conventional unit in which two coating layers, generally a primer layer and a top layer, can be applied successively, it is possible to apply, by employing the coating preparation according to the invention, a satisfactory two-layer coating system, for example a metallic coating and a transparent finish.

It is noted that DE-A-34 07 283 and EP-A-0 274 543 relate to the same problem and object as the present invention. However the coating preparations according to these patent applications comprise a number of components, which have been prepared by special synthesis processes and thus are expensive. In view of these known coating compositions the present preparation is relatively simple and can be easily prepared at reduced costs.

Furthermore the use of barium as bivalent metal offers the advantage, that barium compounds are relatively unharmful to the environment, as they are very stable compounds, which do not decompose under normal conditions.

DESCRIPTION OF THE PREFERRED EMBODIMENTS

The aqueous preparation according to the invention comprises three main components, barium hydroxide, acrylic acid or a derivative thereof, and finally chromium compounds ($Cr^{6+}$ and $Cr^{3+}$). The conventional additives comprise, inter alia, organic and inorganic fillers, matting agents, pigments, detergents, bactericides, other inorganic acids etc.

The hydroxide will partially react with the acrylic acid, as a result of which the latter is partially neutralized. If the hydroxide is present in an amount of more than 30%, based on the acrylic acid, the acrylic acid is neutralized to an excessive extent, as a result of which the dispersion breaks and a solid mass of plastic in water is formed. If less than 8% of hydroxide, based on the acrylic acid, is present in the preparation, good anticorrosion action of the preparation is not obtained, although a preparation containing, for example, 6% of hydroxide does have properties suitable for other applications, for example adhesion properties.

If the preparation contains much acrylic acid, the layer applied will become so thick that the fillers and pigments present therein, which increase the adhesion surface for the benefit of the finish layer, do not project from the layer, adhesion being reduced as a result. If the preparation contains little acrylic resin, the intended effect of the preparation will occur to an insufficient degree.

Preferably, the preparation according to the invention contains at most 6% by weight of acrylic resin or a derivative thereof, more preferably 2–6% by weight. If the preparation contains less than 2% by weight of resin, the stability of the preparation decreases. Suitable materials derived from acrylic acid are, inter alia, polymers such as polyacrylates and resins.

The amount of chromium compounds, of which the $Cr^{6+}$, together with optionally present fluorides, ensures the conversion of the metal, will preferably be in the range of 0.33–0.51% by weight, based on the total weight of the preparation. Depending on the type of metal substrate, for example if applied to steel or galvanized steel, an additional amount of chromic acid (up to approximately 0.5% by weight in the preparation) may be required to etch the metal in order to optimize adhesion. This additional etching may also be carried out by means of compounds containing other acids and oxidizing components and fluoride(s). Optionally present fluorides will preferably be present in an amount of 0.05–0.13% by weight.

A part of the chromic acid is reduced to $Cr^{3+}$, which increases the corrosion-inhibiting effect of the protective layer obtained with the aid of the preparation. If the concentration of chromium compounds in the preparation is outside the abovementioned range, adhesion of the coating layer to the substrate or adhesion of the finishing layer to the coating layer may be inadequate.

Preferably, the acrylic acid derivative employed is an acidic resin thereof.

A preferred composition of the preparation according to the invention for use on aluminium substrates comprises approximately 3% by weight of acrylic acid or a derivative thereof, approximately 0.72% by weight of barium hydroxide and approximately 0.42% by weight of chromium compounds. The remainder of the preparation comprises water and the abovementioned conventional additives.

The coating preparations according to the invention may be prepared in a conventional manner from aqueous solutions of the hydroxide and the acrylic acid.

A preferred embodiment of the method of preparation of the coating preparation according to the invention comprises mixing of a suitable aqueous solution of acrylic acid or a derivative thereof and a suitable amount of barium hydroxide in solid form at a temperature of between 20° and 80° C., whereupon the other conventional additives are added, in the correct amounts, to the aqueous dispersion obtained. With this method the temperature is critical, because at too low or too high a temperature the acrylate will cure. By means of this method a higher acrylic concentration can be obtained in the aqueous solution than if a hydroxide solution is mixed with an acrylic acid dispersion.

The invention also relates to a method for pretreating metal surfaces with the aid of the coating preparation according to the invention and to substrates obtained by means of the method. The preparation according to the invention is usually applied in such an amount to a substrate, that the dry weight of the coating layer obtained therefrom is 0.5–1.0 g/m². If pigment and other fillers are present in the preparation, the dry weight may be up to approximately 3.0 g/m². Most of the known application methods including spraying, rolling and immersion can be used.

The invention will be explained hereinafter with reference to the following examples and comparative examples.

EXAMPLES

Example 1

A coating preparation (PRIMECOAT 94) according to the invention was prepared by mixing the starting materials in the following amounts:

| Amount kg/100 kg | Base material |
|---|---|
| 83.92 | demineralized water |
| 0.72 | barium hydroxide |
| 12.00 | Neocryl W-1220 (acrylate resin 25%) |
| 0.42 | chromic acid |
| 2.94 | additives, comprising amorphous silicate, alcohol, dispersing adjuvant, pigment, surfactant, fillers, fluorides and reductant |

This preparation, when applied to a metal substrate, produces such a conversion layer that corrosion of the substrate is prevented. Additionally, the conversion layer should have such a structure that the adhesion properties are adequate for both adhesion to the substrate and to the finish. When the preparation is applied to aluminium, galvanized steel, for example Galfan and Galvalum, and to steel, a protective layer obtained therefrom replaces both the conversion layer and the primer layer.

If this preparation is employed on steel and zinc, in most cases an additional admixture of an etching solution, comprising inorganic acids and oxidizing components, should be employed, as has already been stated hereinabove. In the examples discussed below the additional admixture comprises 0.5% of an aqueous etching solution containing chromic acid.

Example 2

On aluminium 5050 H26 the following tests were carried out employing three different coating systems. Coating system A consisted of a yellow chromate (AD Chromate 12), the top layer being a matt polyester varnish (Polyceram 16 from HCI coatings). Such a treatment is usual in the manufacture of roof systems on coil coating lines. The baking time was approximately 30 seconds, the baking temperature 300° C. and PMT (maximum temperature reached of the substrate) was 240° C.

Coating system B was identical to coating system A, except that an interlayer of a polyester primer (L206 from Dynamit Nobel) had been applied between the chromating layer and the top layer.

Coating system C was likewise identical to coating system A, except that the yellow chromate had been replaced by a conversion layer according to the invention (PRIMECOAT 94 of EXAMPLE 1).

Immediately after application of the coating systems, a number of standard tests were carried out. These tests are:

I. Adhesion, flat, by cross-hatch test

II. Erichsen (8 mm) with and without cross-hatching

III. Adhesion with bending

The results are shown in Table 1.

TABLE 1

| | Test results of aluminium immediately after application of the coating. | | | | | |
|---|---|---|---|---|---|---|
| System | Test I | Test II with cross-hatching | Test II without cross-hatching | Test III | | |
| | | | | T0 | T1 | T3 |
| A | 5 | 4 | 0 | 0 | 0 | 5 |
| B | 10 | 8 | 9 | 8 | 10 | 10 |
| C | 10 | 9 | 10 | 9 | 10 | 10 |

These tests were also carried out after 2 hours' boiling in demineralized water and after a salt/aqueous acetic acid spray treatment over 500 hours, respectively. The test results are shown in Tables 2 and 3.

TABLE 2

Test results of aluminium after 2 hours' boiling in demineralized water.

| TEST | | A | B | C |
|---|---|---|---|---|
| I | | no blisters | no blisters | no blisters |
| II | | complete detachment | slight detachment | no detachment |
| III | T0 | complete detachment | complete detachment | formation of cracks all the way through |
| | T1 | complete detachment | slight detachment | good |
| | T3 | slight detachment | good | good |

TABLE 3

Test results of aluminium after salt/aqueous acetic acid spray treatment for 500 hours.

| | A | B | C |
|---|---|---|---|
| SAS TEST | 1–2 mm underpaint corrosion approx. 40% of scratch was affected | approx. 1 mm underpaint corrosion approx. 20% of scratch was affected | 0.5–1 mm underpaint corrosion approx. 20% of scratch was affected |

Example 3

Tests comparable with EXAMPLE 2 were carried out on steel employing, likewise with three different coating systems. Coating system D consisted of an iron phosphating system (AD Phosphate H60), the top layer being a matt polyester varnish (Polyceram 16 from HCI coatings). Such a treatment is usual in the manufacture of roof systems on coil coating lines. The baking time, baking temperature and PMT were identical with the values of EXAMPLE 2.

Coating system E was identical with coating system D, except that an interlayer of a polyester primer (L206 from Dynamit Nobel) was present.

Coating system F was likewise identical to coating system D, except that the iron phosphate layer had been replaced by a conversion layer according to the invention (PRIMECOAT 94).

Immediately after application of the coating systems, the abovementioned standard tests I–III were carried out. These standard tests are likewise shown after boiling for 2 hours in demineralized water.

The results are shown in Tables 4 and 5, respectively.

TABLE 4

Test results of steel immediately after application of the coating.

| System | Test I | Test II with cross-hatching | Test II without cross-hatching | Test III T0 | Test III T1 | Test III T3 |
|---|---|---|---|---|---|---|
| D | 0 | 0 | 0 | 0 | 0 | 0 |
| E | 8 | 6 | 9 | 3 | 6 | 9 |
| F | 10 | 8 | 10 | 5 | 8 | 10 |

TABLE 5

Test results of steel after 2 hours' boiling in demineralized water.

| TEST | | D | E | F |
|---|---|---|---|---|
| I | | no blisters | no blisters | no blisters |
| II | | complete detachment | slight detachment | no detachment |
| III | T0 | complete detachment | complete detachment | formation of cracks all the way through |
| | T1 | complete detachment | complete detachment | good |
| | T3 | slight detachment | good | good |

Example 4

On galvanized steel (0.6 mm Z100) which had been subjected to a conventional pretreatment, the following tests were carried out employing three different coating systems. Coating system G consisted of a paint (Gloss 9 according to Gardner, layer thickness 19–21 micrometers) which is normally applied on a primer and which is designed for roof systems. The baking time was approximately 35 seconds, the baking temperature 320° C. and PMT was 240° C.

Coating system H is the system customary in practice, comprising coating system G, an interlayer of a polyester primer (combination of L206/401 from Dynamit Nobel) was being applied.

Coating system K was likewise identical to coating system G, except that the conversion layer according to the invention (PRIMECOAT 94) was employed.

Immediately after application of the coating systems, and after 2 hours' boiling in demineralized water and after a salt/aqueous acetic acid spray treatment for 1000 hours, the abovementioned standard tests were carried out.

The results are shown in Tables 6–8.

TABLE 6

Test results of galvanized steel immediately after application of the coating systems.

| System | Test I | Test II with cross-hatching | Test II without cross-hatching | Test III T0 | Test III T1 | Test III T3 |
|---|---|---|---|---|---|---|
| G | 0 | 0 | 0 | 0 | 0 | 0 |
| H | 8 | 7 | 8 | 6 | 9 | 10 |
| K | 9 | 8 | 8 | 7 | 10 | 10 |

TABLE 7

Test results of galvanized steel after
2 hours' boiling in demineralized water.

| TEST | | G | H | K |
|---|---|---|---|---|
| I | | no blisters | no blisters slight softening | no blisters |
| II | | complete detachment | slight detachment | no detachment |
| III | T0 | unfolding of paint layer | complete detachment | slight loss of adhesion |
| | T1 | unfolding of paint layer | slight detachment | good |
| | T4 | unfolding of paint layer | good | good |

TABLE 8

Test results of galvanized steel after
salt/aqueous acetic acid spray treatment for
1000 hours.

| | G | H | K |
|---|---|---|---|
| SAS TEST | up to approx. 4 mm from the scratch, formation of blisters and detachment took place | approx. 2 mm underpaint corrosion approx. 60% of scratch was affected | approx. 2 mm underpaint corrosion approx. 30% of scratch was affected |

What is claimed is:

1. Coating preparation for pretreating metal surfaces comprising an acrylic acid polymer or a polymer based on acrylic acid at 2–6% by weight, a hydroxide of a bivalent metal and hexavalent and trivalent chromium ions, and water wherein the bivalent metal is barium and the proportion by weight of the acrylic acid polymer or a polymer based on acrylic acid and barium hydroxide is 1:0.08–0.30.

2. Coating preparation according to claim 1, wherein the acrylic acid polymer is an acidic resin.

3. Coating preparation according to claim 1, wherein the preparation contains at most 6% by weight of acrylic resin or a polymer based on acrylic acid.

4. Coating preparation according to claim 1, wherein the preparation comprises 3% by weight of acrylic resin or a polymer based on acrylic acid, 0.72% by weight of barium hydroxide and 0.42% by weight of hexavalent and trivalent chromium ions.

5. Method for preparing a coating preparation according to claim 1, wherein a suitable aqueous solution of acrylic acid or a polymer based on acrylic acid and a suitable amount of barium hydroxide in solid form are mixed together at a temperature of between 20° and 800° C., whereupon the chromic acid is added, in the correct amounts, to the aqueous dispersion obtained.

6. Method for pretreating metal surfaces, wherein a coating preparation according to claim 1 is applied in such a way to a substrate which has been previously degreased and freed of oxide, that the applied layer, after drying, has a dry weight of 0.5–3 g/m$^2$.

* * * * *